United States Patent [19]

Samuels

[11] Patent Number: 4,709,122

[45] Date of Patent: Nov. 24, 1987

[54] NICKEL/INDIUM ALLOY FOR USE IN THE MANUFACTURE OF A HERMETICALLY SEALED CONTAINER FOR SEMICONDUCTOR AND OTHER ELECTRONIC DEVICES

[75] Inventor: George J. Samuels, Bridgewater, N.J.

[73] Assignee: Allied Corporation, Morris Township, Morris County, N.J.

[21] Appl. No.: 814,698

[22] Filed: Dec. 30, 1985

Related U.S. Application Data

[63] Continuation-in-part of Ser. No. 605,436, Apr. 30, 1984, abandoned.

[51] Int. Cl.$^4$ ............................................. H01L 23/10
[52] U.S. Cl. .................................. 174/52 FP; 357/74; 420/441; 437/224
[58] Field of Search ...................... 174/52 FP; 357/74; 220/200, 359; 420/441, 555; 156/DIG. 70, DIG. 100; 29/588

[56] References Cited

U.S. PATENT DOCUMENTS 3,823,468  7/1974  Hascoe ........................ 174/52 FP X
4,105,861  8/1978  Hascoe ............................ 174/52 FP
4,331,253  5/1982  Gordon et al. ...................... 220/200

FOREIGN PATENT DOCUMENTS 2401342  7/1975  Fed. Rep. of Germany .
527911  10/1972  Switzerland .
602879  6/1948  United Kingdom .

OTHER PUBLICATIONS

Translation—De Iorio et al.,—*Electric and Mechanical Characteristics of Electrodeposited Nickel–Indium Alloys.*
Ionychera et al., *Comparative Characteristics of Electrodeposition of Indium Alloys* translated from Zashchita Metallov, vol. 17, No. 1, pp. 129–131, Jan. 1981.
Davidson et al., *Electrodeposition of Alloys* Plating, Oct. 1971, pp. 1007–1009.
Sadana, *Electrodeposition of Alloys* Plating, Feb. 1973, pp. 146–148.
Translation—Rossi et al., *Nickel–Indium Protective Coatings on Kovar,* Technol. Elettr. (Italy), No. 7–8, 82–6, Jul.–Aug. 1979.
Rossi et al., *Elettrodeposizione di Nichel–Indio* La Metallurgia Italiana, No. 2, 1978, pp. 66–68.

Primary Examiner—Arthur T. Grimley
Assistant Examiner—David A. Tone
Attorney, Agent, or Firm—Richard C. Stewart, II; Gerhard H. Fuchs

[57] ABSTRACT

This invention relates to a new and improved hermetically sealed container for semiconductor and other electronic devices, to a novel sealing cover for use in fabricating the above-referenced hermetically sealed container, and to novel processes for manufacturing said container and cover wherein the cover is plated with a nickel/indium alloy in which the weight percent indium in said alloy is less than about 10 weight percent.

35 Claims, 5 Drawing Figures

FIG. 4

NICKEL/INDIUM ALLOY FOR USE IN THE MANUFACTURE OF A HERMETICALLY SEALED CONTAINER FOR SEMICONDUCTOR AND OTHER ELECTRONIC DEVICES

RELATED APPLICATIONS

This application is a continuation-in-part application of application Ser. No. 605,436, filed Apr. 30, 1984 now abandoned.

BACKGROUND OF THE INVENTION

1. Field of the Invention

This invention relates to a new and improved hermetically sealed container for semiconductor and other electronic devices. More particularly, this invention relates to such a container designed and intended to hermetically seal electronic devices, such as semiconductor integrated circuit devices and the like. This invention also relates to a novel sealing cover for use in fabricating the above referenced hermetically sealed container, and to a novel process for manufacturing said container and cover.

2. Prior Art

The majority of semiconductor integrated circuit devices are housed in hermetically sealed packages commonly referred to as dual-in-line, flatpack, and hybrid packages. Several designs of such packages are now in use. Among these is one which consists of a ceramic base, a cover, a lead frame, and solder glass for sealing the frame between the base and the cover, known in the trade as the CERDIP (Trademark) package. Another package type consists of a lead frame sandwiched between layers of a glass-ceramic mixture. A cavity is left in one of the layers and the semiconductor device is sealed into the cavity with a metal lid and solder preform. Premolded and transfer-molded plastic packages are also used. One popular type of package is made from a single layer of ceramic having a screened, conductive lead frame pattern deposited on it, the terminal pins on the side of the package being brazed on to give a so-called "side braze" package. This type of package is also made with two layers of ceramic material with the screened conductive pattern sandwiched between the layers and ordinarily sealed with metal lids and metallic solder preforms. A number of packages comprising hybrids of those described above are also in use.

An especially effective hermetically sealed container for electronic devices is described and claimed in U.S. Pat. No. 4,105,861. The container of this patent comprises a supporting pad for an electronic device, a conductive lead frame surrounding the pad and forming therewith a unitary construction, and a sheet of homogeneous epoxy resin extending over and fused to each face of the frame and its conductive leads, at least one of the sheets having an aperture dimensioned and disposed to surround the supporting pad and a portion of the adjacent leads of the lead frame. The container further comprises upper and lower cover plates of a material of the group comprising metal, ceramic, glass, and rigid plastic fused to the plastic sheets, one of such plates having an opening in registry with the aperture in the adjacent one of the plastic sheets for receiving an electronic device to be supported on the pad. The container further comprises means for hermetically sealing the opening in such one of the cover plates as for example a gold plated KOVAR ® lid with a gold-tin eutectic solder perform.

In an alternative construction, the supporting pad for the electronic device is a portion of the lower cover plate in the form of an upwardly-protruding pedestal and each of the plastic sheets has an aperture dimensioned and disposed to surround such supporting pad and a portion of the adjacent leads of the lead frame, the pedestal extending at least partially through the aperture of the adjacent one of the plastic sheets.

While all of the above-described packages are relative effective, they suffer from some inherent disadvantages. The most pervasive disadvantage is the expense of the container because of the high price of gold, and gold price volatility. For example, the thickness of the gold plating on the KOVAR ®-cover lid is specified as a minimum thickness, typically fifty micrometers. Many millions of these lids are produced each year, and the cost of the gold used in plating the lids is several millions of dollars.

Thus, it is an object of this invention to provide a new hermetically sealed package for electronic devices, as for example semi-conductors, which is relatively low in cost.

It is another object of this invention to provide an improved hermetic sealing means from such containers having reliable hermetic sealing properties.

It is yet another object of this invention to provide a method of fabricating a hermetically sealed container for an electronic device as for example a semi conductor, and a method of fabricating hermetic sealing means for the cover.

Other objects will be apparent from the following description, taken in connection with the accompanying drawings.

SUMMARY OF THE INVENTION

In accordance with this invention, there is provided an improvement in a hermetic sealing cover for a container for an electronic device of the type which comprises a conductive cover element, the improvement comprises a cover element plated with nickel/indium alloy containing less than about 10 weight percent indium based on the total weight of the alloy. This invention also relates to an improved hermetically sealed container for electronic devices of the type having a body with a cavity with an opening, means for supporting one or more electronic devices, one or more electronic devices supported by said supporting means, and hermetic sealing means in hermetically sealing engagement with said opening, the improvement comprising hermetic sealing means which comprises a conductive cover element plated with a nickel/indium alloy containing less than about 10 weight percent indium based on the total weight of the alloy disposed in registry with said opening and hermetically sealed thereto. Other aspects of this invention relate to a method of manufacturing the hermetic sealing cover and the hermetically sealed container of this invention.

DESCRIPTION OF THE PREFERRED EMBODIMENT

Figure 1:
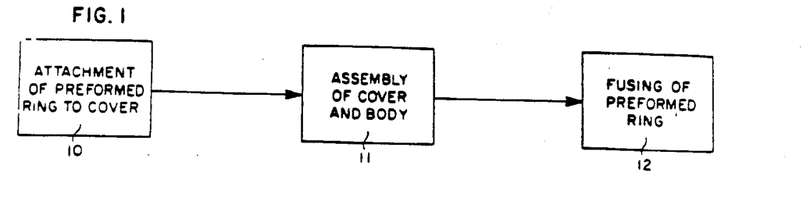
FIG. 1 is a block diagram of a preferred apparatus for fabricating an hermetically sealed container including the fabrication of a sealing cover therefor.

Referring now to the drawing, in FIG. 1 are represented, in schematic form, the three basic steps in fabricating an hermetically sealed container. In unit 10, a preformed sealing ring is attached to the cover, as described hereinafter. In unit 11, the cover-ring unit is assembled with the body and in unit 12, which may be a baking oven, the temperature of the assembly is raised to a value at which the sealing ring is fused to the cover and to the body, completing the hermetic seal.

Figure 2:
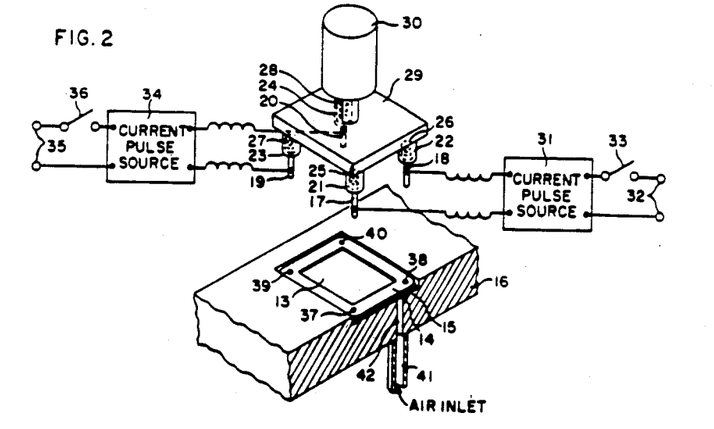
FIG. 2 is a perspective view of a preferred apparatus for attaching a performed solder ring to a cover for the container.

Referring to FIG. 2, there is shown an apparatus suitable for performing the method of fabricating the hermetic sealing cover in accordance with the invention as represented schematically by unit 10 of FIG. 1. In this figure, a flat cover 13 with a superimposed heat-fusible conductive ring 14 is disposed in a shallow cavity 15 of a nonconductive supporting member 16, the cavity having dimensions only slightly larger than those of the cover 13 and the ring 14 to secure registration between the ring 14 and the periphery of the cover. The cover 13 has a thickness preferably of the order of 0.010 inch (0.0254 cm) while the ring 14 is typically, for example, a gold-tin eutectic alloy and alloys which do not contain precious metals such as tin/indium alloys, tin/lead/indium alloys, indium/silver alloys, lead/indium alloys and the like having a thickness of the order of 0.002 inch (0.00508 cm) and the same outer dimensions as those of the cover 13. In the drawing, the thickness dimensions of the elements 13 and 14 are greatly enlarged for the sake of clarity.

Cover 13 is composed of a conductive material plated with a nickel/indium alloy containing at least 0.1 weight percent indium based on the total weight of the alloy. The thickness of the coating is preferably from 2.5 to 3.5 microns. Generally any conductive material known to those of skill in the art can be employed. Illustrative of useful conductive materials are alloys of base metals such as iron, cobalt, nickel, and the like. The preferred conductive materials for use in this invention are cobalt-nickel-iron alloys commercially available under the trademark "KOVAR".

In the preferred embodiments of this invention, the amount of indium in the alloy will vary from 0.1 to less than 10 weight percent indium by total weight of the alloy, and in the particularly preferred embodiments will vary from about 0.1 to 9 weight percent indium on the same basis. Amongst these particularly preferred embodiments of the invention, alloys of this invention which contain from about 1 to about 8 weight percent of indium based on the total weight of the alloy are especially preferred for used in the manufacture of the cover of this invention, and those alloys in which the amount of indium is from 3 to 6 weight percent indium by weight of the alloy are most preferred for this application.

Cover 13 can be manufactured employing conventional methods and techniques. In one embodiment, a strip of base metal, such as KOVAR, is plated with the nickel/indium alloy to a fraction, as for example 40% to 90% of the ultimate required minimum surface plating thickness, which may be from 25 to 100 micrometers. Thereafter the strip is divided into cover elements of a predetermined size which are plated with the nickel/indium alloy to provide a resultant minimum thickness which is of surface plating substantially equal to the required thickness usually from 29 to 200 micrometers, and preferably from about 50 to about 150 micrometers. This method is described and claimed in U.S. Pat. No. 4,284,081. Alternatively, cover elements of a predetermined size can be stamped out of a strip of base metal, such as KOVAR ® and, thereafter plated with the nickel/indium alloy to the desired thickness. In either case, the cover can be plated with nickel/indium alloy to increase the thickness thereof, and thereafter plated with a material composed preponderantly of a precious metal, such as gold or gold alloys, to provide the required thickness.

The nickel/indium alloy for use in the practice of this invention can be prepared by electrodepositing same from a plating bath on to a conducting metal, as for example KOVAR, employing conventional electrodeposition techniques. Useful electrodeposition techniques include both barrel and rack plating. Such conventional techniques which are described in detail in "Electroplating Engineering Handbook" by A. Kenneth Grahams, Ed Van Nostrand Reinhold Co., N.Y., N.Y. (1970) are well known in the electroplating art and will not be described herein in any great detail.

In the preferred embodiments of this invention, the alloy is electroplating from the novel bath claimed in my co-pending U.S. patent application Ser. No. 605,435 application entitled "Novel Nickel/Indium Alloy and Method of Using Same in the Manufacture of Printed Circuit Boards", filed Apr. 30, 1984. The novel bath of that invention comprises:

(a) at least about 0.9M weight percent nickel cations and at least about 0.001M indium cations;
(b) up to about 2.6M chloride ions;
(c) from about 0.25M to 1.6M of a buffer material selected from the group consisting of boric acid, hydroxy carboxylic acids and salts of such carboxylic acids; and
(d) water.

In the preferred embodiments of this invention, the concentration of nickel cations and indium cations in the bath are from about 0.9M to about 2.5M, and from about 0.001 to about 1M, respectively. In the particularly preferred embodiments of the invention, the concentration of nickel cations and indium cations in the bath are from about 0.5M to about 2.0M, and from about 0.009 M to about 0.1 M, respectively. Amongst these particularly preferred embodiments, most preferred are those embodiments ments in which the concentration of nickel cations and indium cations in the bath are from about 1M to about 2 M, and from about 0.015M to about 0.06 M, respectively.

The nickel and indium cations for use in the plating bath of this invention can be derived from any source. In the preferred embodiments of the invention, the nickel on indium cations are derived from nickel and/or indium chloride, metallic indium and/or nickel and water-soluble nickel and/or indium salts of sulfamic acid, nickel and/or indium sulfate salts, hydroxycarboxylic acids and aminocarboxylic acids which do not contain mercapto functions. Illustrative of useful water-soluble nickel and indium salts are the nickel and indium salts of citric acid, acetoacetic acid, glyoxylic acid, pyruric acid, glycolic acid, glyceric acid, malic acid, tartaric acid, hydroxybutyric acid, arginine, aspartic acid, asparagine, gutamic acid, glycine, glutamine, leucine, lysine, threonine, isoleucine, valine, and the like. In the preferred embodiments of the invention, the nickel and indium salts of sulfamic acid are employed as the source of nickel and indium, and in the particularly preferred embodiments of the invention, nickel and indium salts of sulfamic acid are used as the sources of nickel and indium.

The concentration of chloride ions in the bath is from 0 to about 2.6 M. The chloride ions may be obtained from any metal salt which will not electrodeposit under the operational conditions of the bath such as sodium and potassium chloride or from non-metal salts such as ammonium chloride or from nickel or indium chloride. The chloride ions are preferably derived form indium and nickel chloride. In the preferred embodiments of the invention, the concentration of chloride ions in the bath is from about 0.001M to about 2.6M chloride ions, and in the particularly preferred embodiments, the concentration of chloride ions in the bath is from about 0.005M to about 1.6M chloride ions. Amongst these particularly preferred embodiments, most preferred are those embodiments in which the concentration of chloride ions in the bath is from about 0.05M to about 0.25M.

The novel plating bath for use in the electrodeposition of the alloy includes from about 0.2M to about 1.6M of a buffer material selected from the group consisting of boric acid and "hydroxy carboxylic acid". As used herein, a "hydroxy carboxylic acid" is a carboxylic acid having one or more carboxylic acid functions and one or more hydroxy functions, and the salts of such acids. Illustrative of useful hydroxycarboxylic acids are glycolic acid, tartaric acid, lactic acid, citric acid, mandelic acid, ammonium citrate, sodium citrate, sodium tartarate, malic acid, glyceric acid and the like. Hydroxy carboxylic acids are preferred primarily because they provide for better control of the % compositions of the electro-deposited alloy. The preferred hydroxy carboxylic acids for use in the practice of this invention are citric acid, malic acid and ammonium citrate.

In the preferred embodiments of the invention in which boric acid is the buffer material of choice, the concentration of buffer material in the bath is from about 0.1M to about 0.7 M, and in those preferred embodiments of this invention in which a hydroxy carboxylic acid is the buffer material of choice the concentration of buffer material in the bath is from about 0.2M to about 1.3 M. In the particularly preferred embodiments of this invention in which boric acid is the buffer material of choice, the concentration of buffer material in the bath may vary from about 0.4M to about 0.6 M, and in those particularly preferred embodiments of this invention in which a hydroxy carboxylic acid is the buffer material of choice, the concentration of buffer material is from about 0.2M to about 1 M. Amongst the particularly preferred embodiments, most preferred are those embodiments of the invention in which the concentration of boric acid in the bath is from about 0.5 M to about 0.7 M, or in which the concentration of the hydroxy carboxylic acid is from about 0.2M to about 0.7 M.

The bath of this invention may include other optional ingredients which are normally used with or incorporated into plating baths. For example, the plating bath of this invention may include one or more compounds to reduce surface pitting, such as alkyl sulfonic acid salts and the like. Other optional materials which may be included in the bath of this invention are dextrose type stabilizers for indium.

The plating bath of this invention usually has a pH equal to or less than about 5, and preferably from about 1.4 to about 5.0. This preferred pH can be maintained by addition of boric acid when boric acid is used as the buffer material, or can be adjusted by addition of other materials, such as ammonium hydroxide, nickel carbonate, sodium hydroxide, sulfamic acid, hydrochloric acid and the like, or can be adjusted by the hydroxy carboxylic acid, when a carboxylic acid is the buffer material of choice. The particular pH employed in the particularly preferred embodiments of the invention will depend on the particular buffer material used. For example where a hydroxy carboxylic acid, such as citric acid, is the buffer material of choice, the pH will generally vary from about 1.4 to about 4.7, and preferably from about 1.8 to about 3.8. In the particularly preferred embodiments of the invention where a carboxylic acid is used as the buffer material, the pH may vary from about 2.0 to about 2.8, and in the most preferred embodiments of the invention where a carboxylic acid is used as the buffer material, the pH may vary from about 2.1 to about 2.7. On the other hand, experimentation has shown that best results are obtained when boric acid is the buffer material of choice if the pH is maintained in the range of from about 1.5 to about 3.5. In the preferred embodiments of the invention where boric acid is the buffer material of choice, the pH may vary from about 2.0 to about 3.0, and in the particularly preferred embodiments, the pH may vary from about 2.5 to about 3.0. In the most preferred embodiments of the invention in which boric acid is the buffer material of choice, the pH can vary from about 2.8 to about 3.0.

An especially efficacious plating bath for use in the practice of this invention comprises:
(a) from about 0.9M to about 2.M of nickel ions;
(b) from about 0.4M to about 2.5 chloride ions;
(c) from about 0.2M to about 1M of a buffer material selected from the group consisting of boric acid hydroxycarboxylic acids and salts of such caboxylic acids;
(d) from about 0.004M to about 0.05M of indium ions; and
(e) water.

During electrodeposition procedure, the plating bath is normally maintained at a temperature of from about 10° C. to about 80° C. In the preferred embodiments of the invention, the electrodeposition temperature is from about 20° C. to about 65° C., and in the particularly preferred embodiments of the invention, the electrodeposition temperature is from about 35° C. to about 65° C. Amongst the particularly preferred embodiments of the invention, most preferred are those embodiments in which the electrodeposition temperature is from about 35° C. to about 55° C.

In the preferred electrodeposition procedures current densities can vary widely depending to a large extent on whether barrel or rack plating techniques are employed. However, in most embodiments of the invention where rack plating techniques are employed the current density is usually maintained within the range of from about 1 to about 200 millamperes per $cm^2$. In the preferred embodiments of the invention where rack plating techniques are employed, the current density is from about 5 to about 100 milliamperes per cm$^2$, and in the particularly preferred embodiments is from about 1 to about 60 milliamperes per cm$^2$. Amongst these particularly preferred embodiments where rack plating techniques are employed, most preferred are those embodiments in which the current density varies from about 1 to about 40 milliamperes per cm$^2$. When barrel plating techniques are employed, the applied current density is preferably from about 2 to about 10 milliamperes per cm$^2$ and are most preferably from about 3 to about 5 milliamperes per cm$^2$.

The electrodeposition process is carried out for a period of time sufficient to electrodeposit the desired amount of the nickel/indium alloy. As will be apparent to one of skill in the relevant art, electrodeposition times may vary widely depending on a number of factors including but not limited to desired thickness of the electrodeposit, current density, bath temperature and the like. Typically plating times will vary from a few minutes to several hours.

The nickel/indium alloy is particularly useful as a partial or complete replacement for gold in the construction of covers for hermetically sealed containers for electronic devices. This is primarily due to its resistance to corrosion and heat, and its solderability. A series of tests were conducted to demonstrate the benefit characteristics of the nickel/indium alloy which indicate its availability as a total or partial replacement for gold in the manufacture of covers for hermetically sealed containers for electrical devices.

Standardized commercially available nickel sulfamate (Ni(SO$_3$NH$_2$)$_2$) solution (2.55M of nickel sulfamate). is partially diluted with deionized water or distilled water so that the remainder of the bath components can be readily dissolved. Nickel chloride is added along with diammonium citrate. The pH is then adjusted to slightly greater that the desired pH of the working bath by addition of sulfamic acid, a mixture of nickel carbonate and ammonium hydroxide or hydrochloric acid. Next, indium sulfamate (In(SO$_3$NH$_2$)$_3$) as the hydrated salt, is added, followed by addition of a trace amount of a wetting agent (sodium lauryl sulfate). The bath is now brought to a volume of 1 liter by addition of distilled or deionized water and is ready to use. Using the above described procedure, a plating bath was prepared, the physical parameters of which are set forth in the following Table I.

TABLE I

| Component | Amount |
| --- | --- |
| (a) Nickel Sulfamate | 1.3 M |
| (b) Ammonium Citrate | 0.25 M |
| (c) Nickel Chloride | 0.075 M |
| (d) Indium Sulfamate | 0.013 M |
| (e) Sodium Lauryl Sulfate | 0.0004 M |

Using the plating bath of Table I, a series of experiments are conducted to evaluate the usefulness of the nickel/indium alloy as a total or partial replacement for gold in the manufacture of covers for hermetically sealed containers for printed circuit boards. Chip carrier covers manufactured and sold by Semi-Alloys Inc. under the trademark Combo Lid ® are used in the experiments. These chip carrier covers are composed of KOVAR ®, a commercially available iron, nickel and cobalt alloy.

Using the plating bath and process conditions of the following Table II and conventional barrel plating techniques as for example the apparatus and techniques described and claimed in U.S. Pat. Nos. 3,472,753 and 3,498,902, commercially available as the "Sterling" Portable Plating Barrel, the covers were plated with the nickel/indium alloy.

TABLE II

| RUN NO. | PH | CURRENT DENSITY | PLATING TIME | BATH TEMP. | % Composition | |
| --- | --- | --- | --- | --- | --- | --- |
| | | | | | % In. | % Ni |
| 1 | 2.8 | 5 mA/cm.$^2$ | 60 mins. | 40° C. | 5.1 | 94.9 |
| 2 | 2.9 | 5 mA/cm.$^2$ | 120 mins. | 40° C. | 5.1 | 94.9 |

Cross sections were made of samples from each run and the nickel/indium plating thickness at the center and edge of each cover was measured. These results are set forth in the following Table III.

TABLE III

| | PLATING THICKNESS ($\mu$in.) | |
| --- | --- | --- |
| RUN NO. | CENTER | EDGE |
| 1 | 98 | 195 |
| 2 | 310 | 560 |

The samples were evaluated as follows:

CORROSION TEST

Samples from each of Run Nos. 1 to 2 and samples which had been gold plated (50 microinches [1.3 microns]) were submitted for 24 hours to salt spray testing in accordance with procedure of MIL-STD-202, Method 101. Examination of the Ni/In plated samples indicated that there was little or no evidence of corrosion. About 30% of the samples showed some staining and peeling but the latter was probably due to the inappropriate preplating preparation.

The gold plated samples appeared to have been affected more by the salt spray then the samples of Run Nos. 1 to 2 without the gold plate. However the general level of corrosion or rusting was less than that obtained with testing on Standard 100 Ni/50 Au plated lids.

HEAT TEST

Samples from Run Nos. 1 to 2 were heated on a hot plate at 450° C. for 5 minutes and examined for evidence of any blistering or peeling of the plating. The samples were free from blisters, but there was some slight additional peeling due to the general quality of the plating and not to the heat. There was some discoloration of the lids.

SOLDERABILITY TEST

A series of solder tests were run by taking a combination of a hermetic sealing cover and preform, placing it over a nickel/indium plated lid with a load and then running it through a nitrogen furnace to achieve bonding. The results, although not completely successful, were encouraging as the gold-tin preforms did wet the nickel/indium plated surfaces. The major problem was due to failure of the bond between the plate and the lid. Similar results were obtained when tests were run using two Ni/In plated lids and gold-tin solder. These problems were again indicative of inappropriate pretreatment of the samples.

Referring again to FIG. 2, the assembling apparatus disclosed therein further comprises a plurality of pairs of spaced electrodes 17,18 and 19,20, the latter being hidden from view. The electrodes 17 to 20 are slidably supported in holders 21 to 24, inclusive, and biased downwardly by enclosing springs 25 to 28, respectively, depending from an actuating plate 29. Plate 29 is connected to an actuating cylinder 30 of any conventional type so that, when in normal position and depressed downwardly, the electrodes 17 to 20, inclusive, resiliently engaged sealing ring 14 with substantially equal pressures. A separate pulse of current is then passed between the electrodes of each pair. Specifically, a current pulse from a source 31 is applied between electrodes 17 and 18, source 31 being excited from power supply terminals 32 through a switch 33. Similarly, a pulse of current is passed between electrodes 19 and 20 from a current pulse source 34 energized from supply terminals 35 through a switch 36. It is also possible to perform the spot welding by using one power supply where current is passed through the pairs of electrodes as indicated above.

In the operation of the apparatus of FIG. 2, after the cover 13 plated with the nickel/indium alloy, and sealing ring 14 have been disposed in the cavity 15 as illustrated, member 29 is depressed by actuating cylinder 30 so that electrodes 17 to 20 resiliently engage sealing ring 14 at points 37 to 40, respectively. In this manner, current flows from one electrode of a pair through the cover and the sealing ring and out of the other electrode. Actually, the current path is divided between the sealing ring and the cover but sufficient current passes through the point where the electrode engages the sealing ring to form a spot weld between the ring and the cover, as indicated. If all of the electrodes were attached to a single power supply, the current would divide between the several electrodes in proportion to the several resistance paths, some electrodes carrying more current than others so that certain of the electrodes might not form a reliable spot weld.

After sealing ring 14 has been attached to cover 13 as just described, air is applied through a conduit 41 and a passage 42 through the supporting member 16 to the under side of cover 13 to blow the cover from the cavity 15, for example into a receiving funnel of an automatic assembling apparatus.

Figure 3:
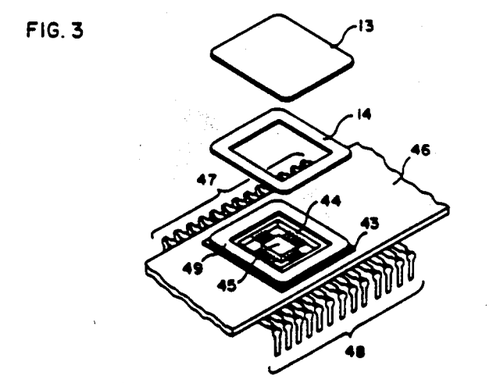
FIG. 3 is a perspective exploded view of a preferred hermetically sealed semiconductor device incorporating the improvement of this invention.

In FIG. 3 is illustrated the method of attachment of cover-sealing ring unit 13-14, fabricated as described, to a container 43 having a cavity 44 in which is disposed a semiconductor device 45. As indicated, the container 43 is carried by an enlarged supporting member 46 which may be of ceramic material and carries terminal pins 47,48 sealed in the ceramic support 46 and terminating in the leads to the semiconductor device 45. Terminal pins 47 to 48 may be plated with gold or a gold based alloy, or may be plated entirely with a nickel/indium alloy or may plated first with the nickel, indium alloy followed by plating with gold or gold based alloy to the minimum desired thickness. Usually the weight percent indium in the alloy is from about 0.1 to about 95 weight percent indium based on the total weight of the alloy. In the preferred embodiments of the invention, the weight percent indium in the alloy plated to terminal runs 47 to 48 is from about 0.1 to about 9 weight percent by total weight of the alloy, and in the particularly preferred embodiments is from about 2 to about 8 weight percent indium on the aforementioned basis. The manufacture of such alloy, and its use as a total or partial replacement for gold or gold based in the fabrication of the electrical contact areas of electrical devices is claimed and described in my copending U.S. patent application Ser. No. 605,435, entitled "Novel Nickel/Indium Alloy For Use in The Manufacture of Electrical Contact Areas Electrical Devices", filed Apr. 30, 1984. The container 43 may be either of ceramic material or metallic; if ceramic, a conductive ring 49 is fused to the container surrounding the cavity 44.

Alternatively, the improvement of this invention may be incorporated into hermetically sealed containers for semiconductors and other electronic devices of the type described and claimed in U.S. Pat. No. 4,109,861.

Figure 4:
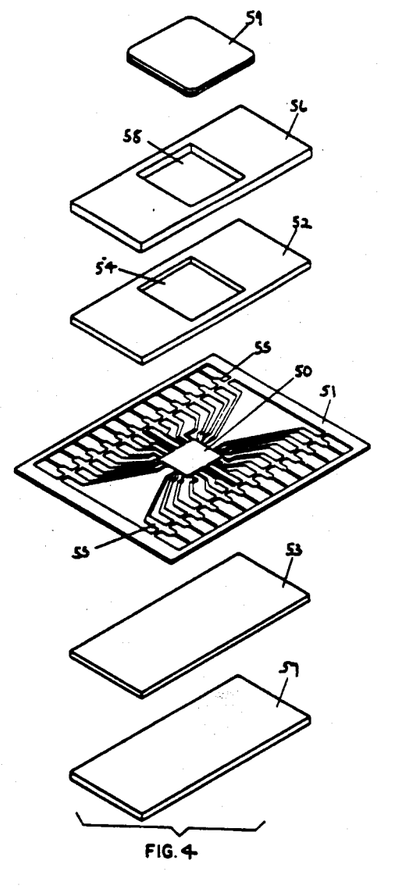
FIG. 4 is a perspective exploded view of a preferred hermetically sealed semi conductor device incorporating the improvement of this invention.

Referring now to FIG. 4 of the drawings, there is shown in exploded perspective view an hermetically sealed container for electronic devices embodying the invention. This container comprises a supporting pad 50 for an electronic device and a conductive lead frame 51 of conventional construction surrounding the pad and forming therewith a unitary construction. Layers of thermosetting plastic material 52 and 53 extend over and are fused to either side of the lead frame 51 and its conductive leads. The layers 52 and 53 are preferably of homogeneous epoxy resin in sheet, paste, or liquid form, in the latter case being partially thermoset to adhere to the frame 51. The term homogeneous is used herein and in the appended claims in its usual sense to refer to a material uniform in composition and structure thruout its mass, as a solution or a crystal (CHEMICAL & ENGINEERING DICTIONARY, Chemical Publishing Company, Inc., New York, N.Y.) to distinguish from materials consisting of a mixture of particles of two or more substances. The plastic layer 52 in sheet form has an aperture 54 dimensioned and disposed to surround the supporting pad 50 and a portion of the leads 55 of the lead frame 51. The container also includes upper and lower cover plates 56 and 57 respectively, of a material impervious to moisture and air fused to the plastic sheets 52 and 53, respectively. The cover plates are preferably of a material of the group comprising metal, ceramic, glass, and rigid plastic. The cover plate 56 adjacent the plastic sheet 52 has an aperture 58 in registry with the aperture 54 of the sheet 52 for receiving an electronic device to be supported on the pad 10.

The container of FIG. 4 also includes means for hermetically sealing the opening 58 in cover plate 56 with a cover element plated with a nickel/indium alloy containing from about 0.1 to less than 10 weight percent indium based on the total weight of indium, preferably from 0.1 to 9 weight percent indium, or a laminate of the said nickel/indium alloy and a material composed preponderantly of a precious metal such as gold or a gold alloy. This may be a combined cover plate solder-preformed unit 59, for example of the type described hereinabove in the description of the device of FIG. 3.

The following specific examples are presented to more particularly illustrate the invention and should not be construed as limitations thereon.

EXAMPLE I

A series of experiments were conducted to demonstrate the effect of the % indium in the alloy of this invention on the resistance of the alloy to environmental attack. The general procedure employed is as follows.

Standardized commercially available nickel sulfamate (Ni(SO$_3$NH$_2$)$_2$) solution (2.55M of nickel sulfamate) is partially diluted with deionized water or distill water so that the remainder of the bath components can be readily dissolved. Nickel chloride is then added to the bath. The pH is then adjusted to slightly greater that the desired pH of the working bath by addition of a mixture of sodium hydroxide and ammonium hydroxide to form sodium/ammonium citrate in the bath, indium sulfamate (In(SO$_3$NH$_2$)$_3$) as a hydrated salt, is then added, followed by addition of a trace amount of a wetting agent (sodium lauryl sulfate). The bath is then brought to a volume of 1 liter by addition of distilled or deionized water and is ready to use. Using the above-described procedure, a plating bath was prepared which was used to barrel plate certain subtrates with nickel/indium alloys having varying indium concentrations. In this barrel plating procedure, the barrel was put through two five-minute deionized water rinses prior to plating. The parts were sorted from the dummy material and placed in a beaker of deionized water. The parts were then sonicated for 5 minutes. The water was then drained from the beaker and replaced with methanol. The parts were then sonicated for an additional 5 minutes in the methanol. The methanol was drained, and the parts were allowed to air dry. The pins were sonicated in a beaker of methanol for 10 minutes to remove machining oils. The parts were then etched in a beaker with a 20% volume HCl/50 g ferric chloride solution for 5 minutes. The parts were swirled occasionally to insure uniform etching. The parts were then rinsed thoroughly with deionized water to remove any iron residue. The parts were then sonicated in a beaker of plating solution for 5 minutes. The parts were then poured into a 4×6 plating barrel containing activated dummy material and plated.

The plating conditions and the % indium in the alloy are set forth in the following Table IV.

TABLE IV

| | Exp No. | % In | Bath pH | [Citrate] M | [In] M |
|---|---|---|---|---|---|
| I | 1 | 5.1 | 3.5 | 0.25 | 5 |
| | 2 | 8.4 | 3.5 | 0.25 | 5 |
| | 3 | 3.4 | 3.5 | 0.25 | 5 |
| II | 1 | 3.0 | 3.2 | 0.50 | 5 |
| | 2 | 3.4 | 3.2 | 0.50 | 5 |
| | 3 | 4.1 | 3.2 | 0.50 | 5 |

The substrates were then subjected to steam aging. In this procedure, the parts were inserted into a circular piece of plastic mesh with their solder cups up. A two liter beaker partially filled with deionized water was placed on a hot plate and was brought up to boiling temperature. The plastic mesh holding the parts was attached to the stem of plastic funnel, and the funnel was then placed into the beaker containing the boiling water.

When the vapor temperature reached 100° C., the steam aging cycle began. The parts were exposed to 100° C. steam for 60 minutes. After the 60 minute steam treatment, the funnel was removed and the parts were allowed to air dry.

After aging, the contact resistance ("CR") of the substrates (ten replicates) was evaluated. In this procedure, the substrates are mated. With the current supply switched to dummy cell, leads are connected to the mated substrates. After the leads are in place, a 100 ma current is applied to the mated substrates, and the voltage allowed to stabilize for two minutes. The voltage across the mated substrates is read and is converted to millohms. Initial contract resistances and contact resistances after steam aging are set forth in the following Table V.

TABLE V

| | CR (m Ω) | |
|---|---|---|
| Substrate | Average CR Before | Average CR After |
| I (1) | 0.57 | 1.09 |
| I (2) | 0.66 | 1.06 |
| I (3) | 0.56 | 0.96 |
| II (1) | 0.54 | 1.02 |
| II (2) | 0.56 | 1.14 |
| II (3) | 0.56 | 1.88 |

EXAMPLE II

A series of experiments were carried out to demonstrate the superior resistance of substrates plated with the alloy of this invention containing less than about 10% by weight indium as compared to substrates plated with the alloy of Rossi et al. and De Iorio et al. publications which contain 10% by weight or greater amounts of indium. Using the procedure of Example II, four replicates of four substrates were plated with nickel/indium alloys containing varying amounts of indium. The plating conditions and the average percent in the alloy are set forth in the following Table VI.

TABLE VI

| | S1 | S2 | S3 | S4 |
|---|---|---|---|---|
| Current Density (A/ft$^2$) | 5.0 | 10.0 | 7.5 | 15.0 |
| Temperature (°C.) | 55° C. | 55° C. | 55° C. | 55° C. |
| Plating Time (Min) | 60 | 30 | 45 | 30 |
| Bath pH | 3.20 | 3.23 | 3.21 | 3.13 |
| Bath Voltage | 3.75 v | 7.2 v | 5.5 v | 11.05 v |
| Barrel Speed | 10 | 10 | 10 | 10 |
| Surface Area | 2.11 | 2.11 | 2.11 | 2.11 |
| Barrel Type | 4" × 6" (#4A) | 4" × 6" (#4A) | 4" × 6" (#4A) | 4" × 6" (#4A) |
| Bath Agitation | 30 Flow meter | 30 Flow meter | 30 Flow meter | 30 Flow meter |

The initial contact resistance of the four replicates of each substrate was evaluated and contact resistance of the replicates was evaluated after steam aging as described in Example II. The results are set forth in the following Table VII and the average contact resistance after steam aging are plotted as a function of the percent indium in the alloy in FIG. 5.

TABLE VII

| | | Average Contact Resistance (m Ω) | |
|---|---|---|---|
| Substrate | Weight % Ins | Before Steam Aging | After Steam Aging |
| S1 | 20.5 | 0.89 | 3.01 |
| S2 | 13.9 | 1.53 | 1.11 |
| S3 | ~16 | 0.71 | 1.37 |
| S4 | 5.7 | 0.55 | 0.76 |

Figure 5:
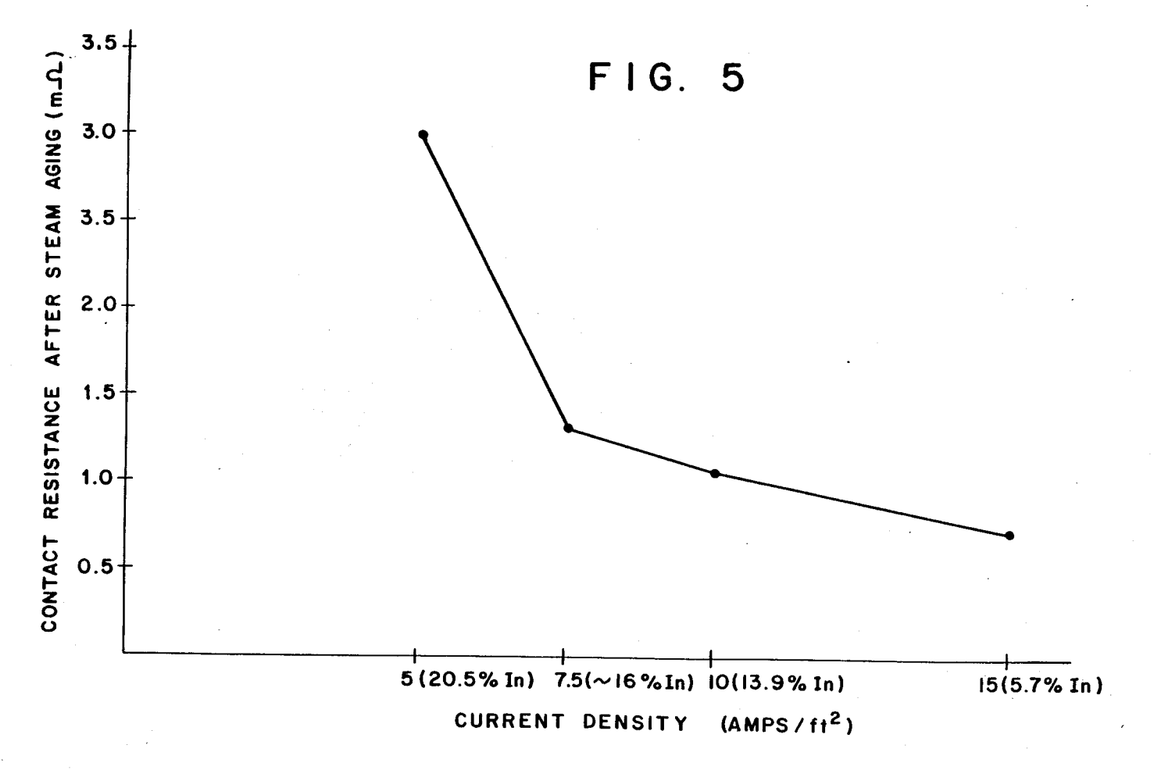
FIG. 5 is a graph of the contact resistance as a function of the % Indium in the alloy.

It is clear from FIG. 5 and the data of Table VII, that the contact resistance of the substrate coated with the alloy of this invention having less than about 10% by weight indium is much more resistant to environmental attack as demonstrated by lower contact resistances after steam aging.

What is claimed is:

1. In an improved hermetic sealing cover for hermetically sealing a container for one or more electronic devices, said improvement comprising a cover plated with a nickel/indium alloy wherein the weight percent indium is less than about 10 weight percent based on the total weight of the alloy.

2. A cover according to claim 1 wherein said weight percent indium is from 0.1 to less than about 10 weight percent indium based on the total weight of the alloy.

3. A cover according to claim 2 wherein said weight percent indium is from about 0.1 to about 9 weight percent indium based on the total weight of the alloy.

4. A cover according to claim 3 wherein said weight percent indium is from about 1 to about 8.

5. A cover according to claim 4 wherein said weight percent indium is from about 3 to about 6.

6. A cover according to claim 1 which comprises:
a conductive cover element plated with a nickel/indium alloy wherein the weight percent indium is less than about 10 weight percent based on the total weight of the alloy; and
a preformed ring of heat-fusible conductive material disposed in registry with the periphery of said cover element and fused thereto at a plurality of spaced points.

7. A cover according to claim 6 in which said ring is fused to said cover element by spot welding.

8. A cover according to claim 6 wherein said heat-fusible conductive material is a solder or brazing alloy.

9. A cover according to claim 8 wherein said material is a brazing alloy.

10. A cover according to claim 8 wherein said material alloy is selected from the group consisting of Au/Sn, Sn/In, Sn/Pb/Ag, Sn/Pb/In, In/Ag and Pb/In alloys.

11. In an improved hermetically sealed container for electronic devices of the type comprising a body with a cavity having an opening, means for supporting one or more electronic devices, one or more electronic devices supported by said supporting means, and hermetic sealing means in hermetically sealing engagement with said opening, the improvement comprising hermetic sealing means which comprises a conductive cover element plated with a nickel/indium alloy containing less than about 10 weight percent indium disposed in registry with said opening and hermetically sealed thereto.

12. A sealed container according to claim 11 wherein said cover is hermetically sealed to said opening by a solder or brazing alloy.

13. A sealed container according to claim 12 wherein cover is hermetically sealed to said opening by a brazing alloy.

14. A sealed container according to claim 13 wherein said brazing alloy is selected from the group consisting of Sn/In, Sn/Pb/In, Sn/Pb/Ag, In/Ag, Au/Sn and Pb/In alloys.

15. A sealed container according to claim 11 comprising:
a supporting pad for one or more electronic devices;
one or more electronic devices positioned on said pad;
a conductive lead frame surrounding said pad in electrical connection with said devices;
a sheet of homogeneous plastic material extending over and fused to each face of said frame and its conductive leads, at least one of said sheets having an aperture dimensioned and disposed to surround said supporting pad and a portion of the adjacent leads of said lead frame;
upper and lower cover plates of material impervious to moisture and air fused to said plastic sheets, one of said plates having an opening in registry with the aperture in the adjacent one of said plastic sheets for receiving an electronic device to be supported on said pad; and
means for hermetically sealing said opening in said one of said plates comprising a conductive cover element plated with a nickel/indium alloy containing less than about 10 weight percent indium based on the total weight of the alloy.

16. A sealed container according to claim 15 wherein said weight percent indium is from about 0.1 to about 9 weight percent based on the total weight of the alloy.

17. A sealed container according to claim 16 wherein said weight percent indium is from about 2 to about 8 weight percent indium based on the total weight of the alloy.

18. A sealed container according to claim 17 wherein said weight percent indium is from about 3 to about 6 weight percent indium based on the total weight of the alloy.

19. A sealed container according to claim 15 in which said lead frame and supporting pad are of unitary construction.

20. A sealed container according to claim 15 in which said sheets of plastic material are composed substantially of epoxy resin and said cover plates are of a material of the group comprising metal, ceramic, glass, and rigid plastic.

21. A sealed container according to claim 15 in which the means for sealing the opening in said one of said plates is an upset cavity forming an integral portion thereof.

22. A sealed container according to claim 15 wherein said supporting pad is a portion of the lower cover plate and each of said plastic sheets has an aperture dimensioned and disposed to surround said supporting pad and a portion of the adjacent leads of said lead frame.

23. A sealed container according to claim 22 in which the portion of the lower cover plate forming said supporting pad is in the form of a pedestal extending at least partially through the aperture of the adjacent one of said plastic sheets.

24. In an improved method of fabricating a hermetically sealed container consisting of a body having a cavity therein for receiving a semiconductor device and a cobalt-nickel-iron alloy sealing cover therefor comprising:
superimposing upon the sealing cover and in registry with the periphery thereof a preformed ring of heat-fusible material of a thickness which is a minor fraction of that of said cover;
engaging said ring with at least one pair of spaced electrodes; passing a pulse of current through said electrodes, said ring, and said cover, thereby producing an effective attachment between said ring and said cover adjacent each of said electrodes;
disposing a semiconductor device in said cavity; assembling said cover on said body with said ring in contact with said body surrounding said cavity; and
heating said assembly to a temperature sufficient to fuse said ring to said cover and to said body, said improvement comprising a sealing cover plated with a nickel/indium alloy containing less than about 10 weight percent indium by weight of the alloy.

25. The method of fabricating a hermetically sealed container in accordance with claim 24 in which said body is metallic and said cover is assembled directly on said body with said cover ring surrounding said cavity.

26. In an improved method of fabricating a hermetically sealed container consisting of a body having a cavity therein for receiving a semiconductor device and a conductive cover therefor comprising:

superimposing a preformed ring of heat-fusible conductive material upon the sealing cover and in registry with the periphery thereof;

engaging said ring with at least one pair of spaced electrodes;

passing a pulse of current in series through said electrodes of each pair, said ring, and said cover, thereby producing an effective attachment between said ring and said cover adjacent each of said electrodes;

disposing a semiconductor device in said cavity; assembling said cover on said body with said ring in contact with said body surrounding said cavity; and heating said assembly to a temperature sufficient to fuse said ring to said cover and to said body, said improvement comprising a conductive cover plated with a nickel/indium alloy containing less than about 10 weight percent indium based upon the total weight of the alloy.

27. The method of fabricating a hermetically sealed container in accordance with claim 26 in which the heat-fusible material is selected from the group consisting of Sn/In, Sn/Pb/In, Sn/Pb/Ag, In/Ag, Au/Sn and Pb/In alloys.

28. The method of fabricating a metallic hermetic sealing cover for a container which comprises plating a cover element of a pre-determined size comprising a base metal with a material comprising a nickel/indium alloy containing less than about 10 weight percent indium by weight of the alloy to a required minimum thickness.

29. The method of fabricating a metallic hermetic sealing cover for a container comprising:

plating a strip of base metal with a material comprising a nickel/indium alloy containing less than about 10 weight percent indium by weight of the alloy to a fraction of the ultimate required minimum surface plating thickness;

dividing said strip into cover elements of predetermined size; and plating said cover elements with said material to provide a resultant minimum thickness of surface plating substantially equal to required minimum thickness.

30. The method of fabricating a metallic hermetic sealing cover in accordance with claim 29 wherein said weight percent indium is from about 0.1 to about 9.

31. The method of fabricating a metallic hermetic sealing cover in accordance with claim 29 in which the base metal strip is plated to a thickness of 40% to 90% of the ultimate required minimum plating thickness.

32. The method of fabricating a metallic hermetic sealing cover in accordance with claim 29 in which the required minimum surface plating is within the range of 25 to 100 microinches.

33. The method of fabricating a metallic hermetic sealing cover in accordance with claim 29 in which the plating of said cover element is by barrel-plating.

34. The method of fabricating a metallic hermetic sealing cover for a container comprising:

plating a strip of base metal with a material comprising a nickel/indium alloy containing less than about 10 weight percent indium by weight of the alloy to a fraction of the ultimate required minimum thickness;

dividing said strip into cover elements of predetermined step; and plating said cover elements with a material comprising preponderantly a precious metal to provide a resultant minimum thickness of surface plating substantially equal to the required minimum thickness.

35. In an improved hermetic sealing cover for hermetically sealing a container for one or more electronic devices, said improvement comprising a cover plated with a laminate comprising a layer of nickel/indium alloy wherein the weight percent indium is less than about 10 weight percent based on the total weight of the alloy and a layer or material comprising preponderantly a precious metal plated to said alloy.

* * * * *